(12) United States Patent
Daun-Lindberg et al.

(10) Patent No.: US 7,058,526 B2
(45) Date of Patent: Jun. 6, 2006

(54) METHOD, APPARATUS AND COMPUTER PROGRAM PRODUCT FOR IMPLEMENTING ENHANCED POWER SYSTEM WITH OPTIMIZED FUSE PLACEMENT AND SIZING

(75) Inventors: Timothy Charles Daun-Lindberg, Rochester, MN (US); Patrick Kevin Egan, Rochester, MN (US); Richard John Fishbune, Rochester, MN (US); Nathan Carl Mandelko, Chatfield, MN (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 10/901,592

(22) Filed: Jul. 29, 2004

(65) Prior Publication Data

US 2006/0025943 A1 Feb. 2, 2006

(51) Int. Cl.
*G01R 31/07* (2006.01)

(52) U.S. Cl. .............................. 702/65; 702/60; 702/64; 324/550; 361/93.1

(58) Field of Classification Search ................ 702/65, 702/57–60, 62, 64, 108, 117–119, 122, 124, 702/182, 183, 185, 186, 189; 324/500, 507, 324/512, 537, 771, 578, 550; 361/93.1–93.3, 361/93.9, 104, 111, 833, 642, 87, 63, 31, 361/1; 700/292, 293
See application file for complete search history.

(56) References Cited

U.S. PATENT DOCUMENTS

| | | | |
|---|---|---|---|
| 4,858,054 A * | 8/1989 | Franklin | 361/57 |
| 6,549,880 B1 * | 4/2003 | Willoughby et al. | 703/13 |
| 2004/0060014 A1 * | 3/2004 | Khalil | 716/1 |

* cited by examiner

*Primary Examiner*—Hal Wachsman
(74) *Attorney, Agent, or Firm*—Joan Pennington

(57) ABSTRACT

A method, apparatus and computer program product are provided for implementing power system performance. Power supply system data are processed and a power path in a power supply system having a predefined component failure mode is identified for placement of a fuse. Transient and steady state current levels are determined for each identified power path. A fuse size is selected within an identified fuse size range based upon the determined transient and steady state current levels. A selected fuse energy rating is lower than an energy rating of the solid-state devices in the identified power path.

20 Claims, 9 Drawing Sheets

METHOD, APPARATUS AND COMPUTER PROGRAM PRODUCT FOR IMPLEMENTING ENHANCED POWER SYSTEM WITH OPTIMIZED FUSE PLACEMENT AND SIZING

FIELD OF THE INVENTION

The present invention relates generally to the electronic design automation field, and more particularly, relates to a method, apparatus and computer program product for implementing enhanced power system performance by optimizing the placement and sizing of fuses.

DESCRIPTION OF THE RELATED ART

To provide improved power system performance, a need exists for effective placement and sizing of fuses to protect against possible system faults while normally enabling reliable operation be provided by the power system. However, in existing power supply systems fuses are not used strategically through out the power system, so that system faults often result in combustion, smoke, smell and explosive events.

Moreover, electronic equipment manufacturers have conventionally selected the largest fuse allowable under the relevant Underwriters Laboratories ("UL") standard in order to minimize the chance that a fuse will blow and unnecessarily stop the piece of electronic equipment. One problem with this approach, however, is that some electronic components will generate smoke before they exceed the maximum power allowed under the relevant UL standards. Although this smoke is harmless, many Asian countries require that the incident be reported. These reports, in turn, can be a significant administrative burden, particularly for large data centers with thousands of individual pieces of electronic equipment.

It is desirable to provide such placement and sizing of fuses to significantly reduce smoke, smell and explosive events associated with the failure of solid state and reactive components in the main power path in a switching power supply.

SUMMARY OF THE INVENTION

Principal aspects of the present invention are to provide a method, apparatus and computer program product for implementing enhanced power system performance. Other important aspects of the present invention are to provide such method, apparatus and computer program product for implementing enhanced power system performance substantially without negative effect and that overcome some disadvantages of prior art arrangements.

In brief, a method, apparatus and computer program product are provided for implementing enhanced power system performance. Power system data are processed and a power path in a power supply system having a predefined component failure mode is identified for placement of a fuse. Transient and steady state current levels are determined for each identified power path. A fuse size is selected within an identified fuse size range based upon the determined transient and steady state current levels.

In accordance with features of the invention, the power path having a predefined component failure mode identified for fuse placement includes each identified power path that could burn due to a solid-state device failure. The selected fuse size is optimized so that the fuse opens before combustion occurs in the component failure mode. A selected fuse energy rating is lower than an energy rating of the solid-state devices in the identified power path.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method is provided that automates the process of optimizing fuse placement and sizing for enhanced power system performance. The method of the invention substantially reduces the production of smoke, smell and explosive events otherwise associated with the failure of solid state and reactive components in a main power path in a power system, such as, a switching power supply.

Figure 1:
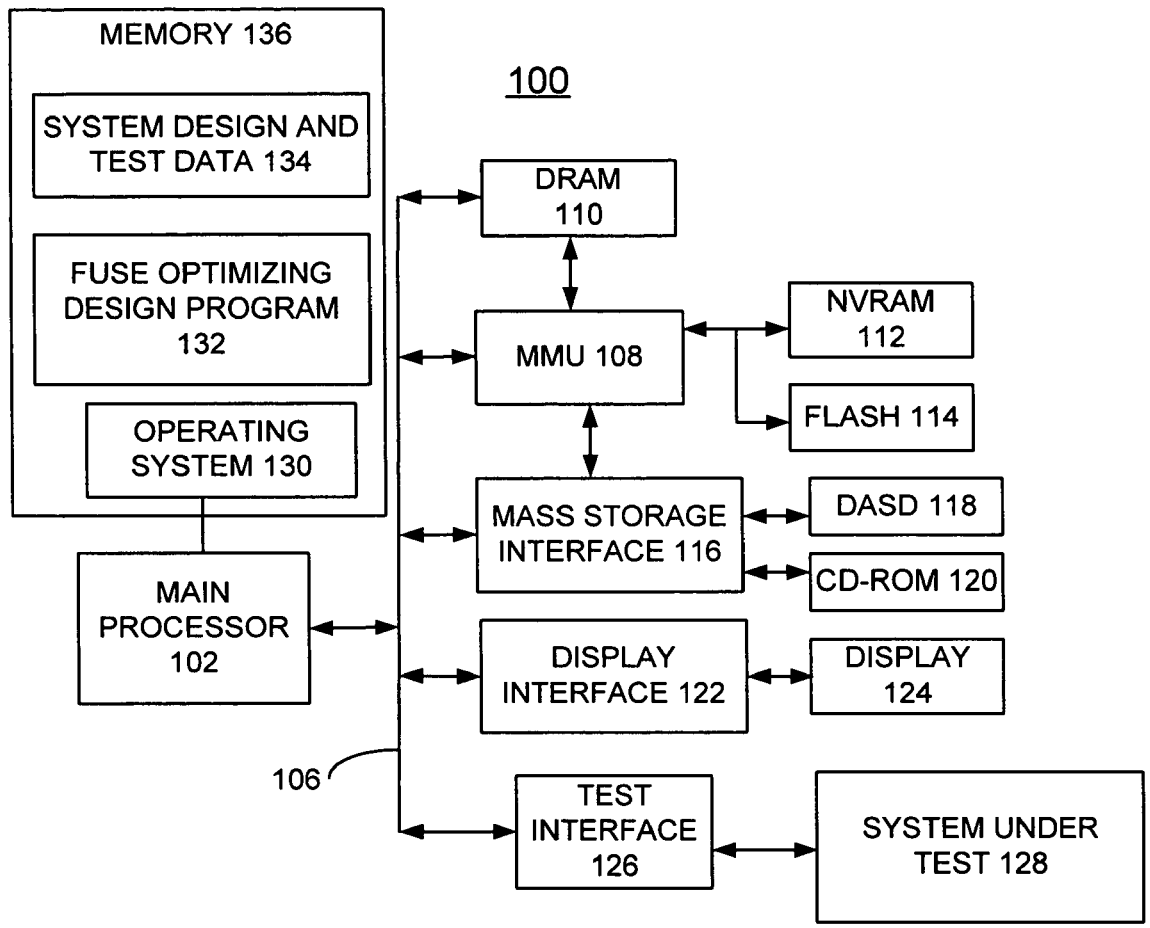
FIG. 1 is a block diagram representations illustrating an exemplary computer test system for implementing fuse placement and sizing for enhanced power system performance in accordance with the preferred embodiment.

Referring now to the drawings, in FIG. 1 there is shown an exemplary computer test system generally designated by the reference character 100 for implementing fuse placement and sizing for enhanced power system performance in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. A system under test 128 is coupled to the test interface 126. The system under test 128 includes, for example, a power system including a plurality of solid-state devices. Computer system 100 includes an operating system 130, a fuse optimizing design program 132 of the preferred embodiment, and system design and test data 134 of the preferred embodiment resident in a memory 136.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 2A:
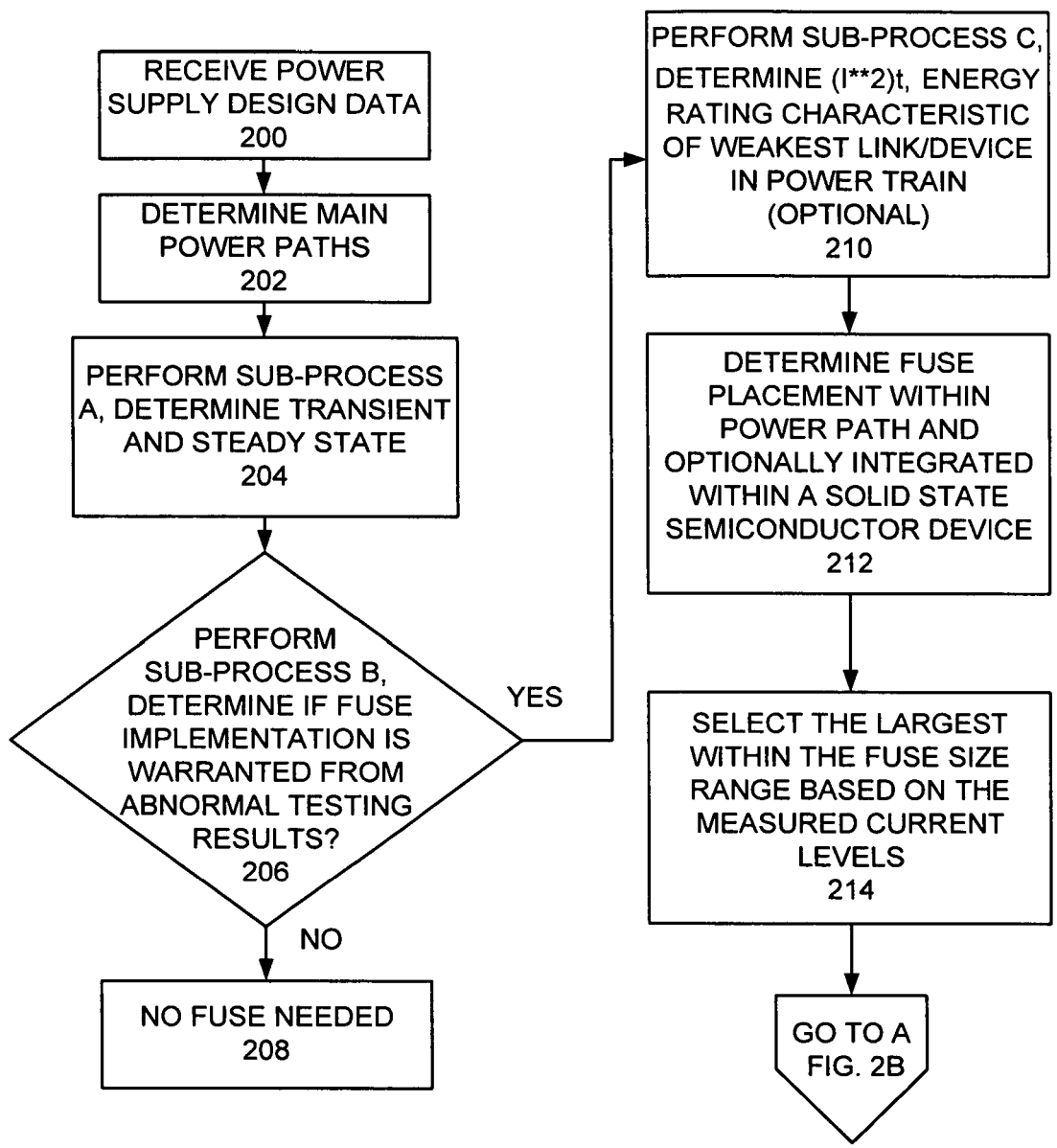
FIGS. 2A and 2B together provide a flow chart illustrating exemplary steps of a method for implementing fuse placement and sizing for enhanced power system performance in accordance with the preferred embodiment.
Figure 2B:
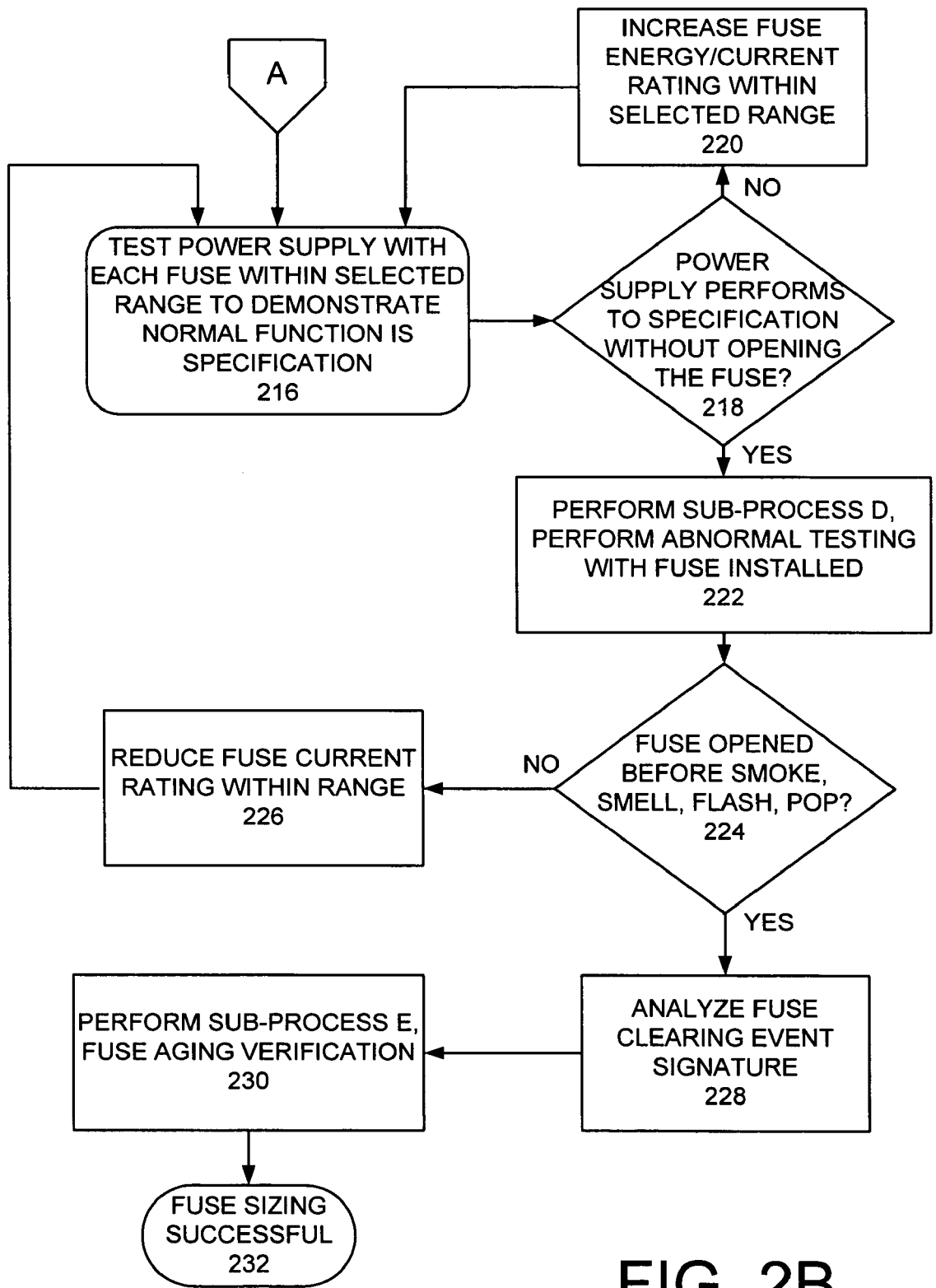

Referring now to FIGS. 2A and 2B, there are shown exemplary steps of a method for implementing fuse placement and sizing for enhanced power system performance in accordance with the preferred embodiment. Power supply design data are received as indicated in a block 200. The power supply design data is processed and main power paths are determined as indicated in a block 202.

Next a sub-process A is performed to determine transient and steady state current levels as indicated in a block 204. Sub-process A is illustrated and described with respect to FIG. 3. Then a sub-process B is performed to determine if a fuse implementation is warranted from abnormal testing results as indicated in a decision block 206. Sub-process B is illustrated and described with respect to FIG. 4. If a fuse implementation is not warranted from abnormal testing results, then the sequential steps end as indicated in a block 208 with no fuse needed. Otherwise if a fuse implementation is warranted from abnormal testing results, then an optional sub-process C is performed to determine an energy-rating characteristic of a weakest link or device in the power train as indicated in a block 210. Sub-process C is illustrated and described with respect to FIG. 5.

Fuse placement within the power path is determined and optionally the fuse is integrated within a solid state semiconductor device as indicated in a block 212. When the fuse is integrated within a solid state semiconductor device in the power path, this device typically is a MOSFET (metal oxide semiconductor field effect transistor). However, it should be understood that the fuse can be integrally formed with various other devices, such as a diode, a bipolar transistor, a IGBT (insulated gate bipolar transistor), an inductor, a capacitor, and a SCR (silicon controlled rectifier). A largest size fuse is selected within a fuse size range based on the measured current levels as indicated in a block 214. Then the exemplary steps continue following entry point A in FIG. 2B.

Then the power supply is tested with each value fuse within the selected range to demonstrate normal function to specification as indicated in a block 216 following entry point A in FIG. 2B. Checking is performed to determine whether the power supply performs to specification without opening the fuse as indicated in a decision block 218. If the power supply fails to perform to specification without opening the fuse, then the fuse energy/current rating is increased within the selected range as indicated in a block 220 and the power supply is tested again at block 216. If the power supply performs to specification without opening the fuse, then a sub-process D is performed, performing abnormal testing with the fuse installed as indicated in a block 222. Sub-process D is illustrated and described with respect to FIG. 6. Checking is performed to determine whether the fuse opened before smoke, smell, flash, or pop as indicated in a decision block 224. If the fuse failed to open before smoke, smell, flash, or pop, then the fuse energy/current rating is reduced as indicated in a block 226 and the power supply is tested again at block 216. If the fuse opened before smoke, smell, flash, and pop, then a fuse clearing event signature is analyzed as indicated in a block 228. A sub-process E is performed for fuse aging verification as indicated in a block 230 and the fuse sizing is successfully completed as indicated in a block 232. Sub-process E is illustrated and described with respect to FIG. 7.

Figure 3:
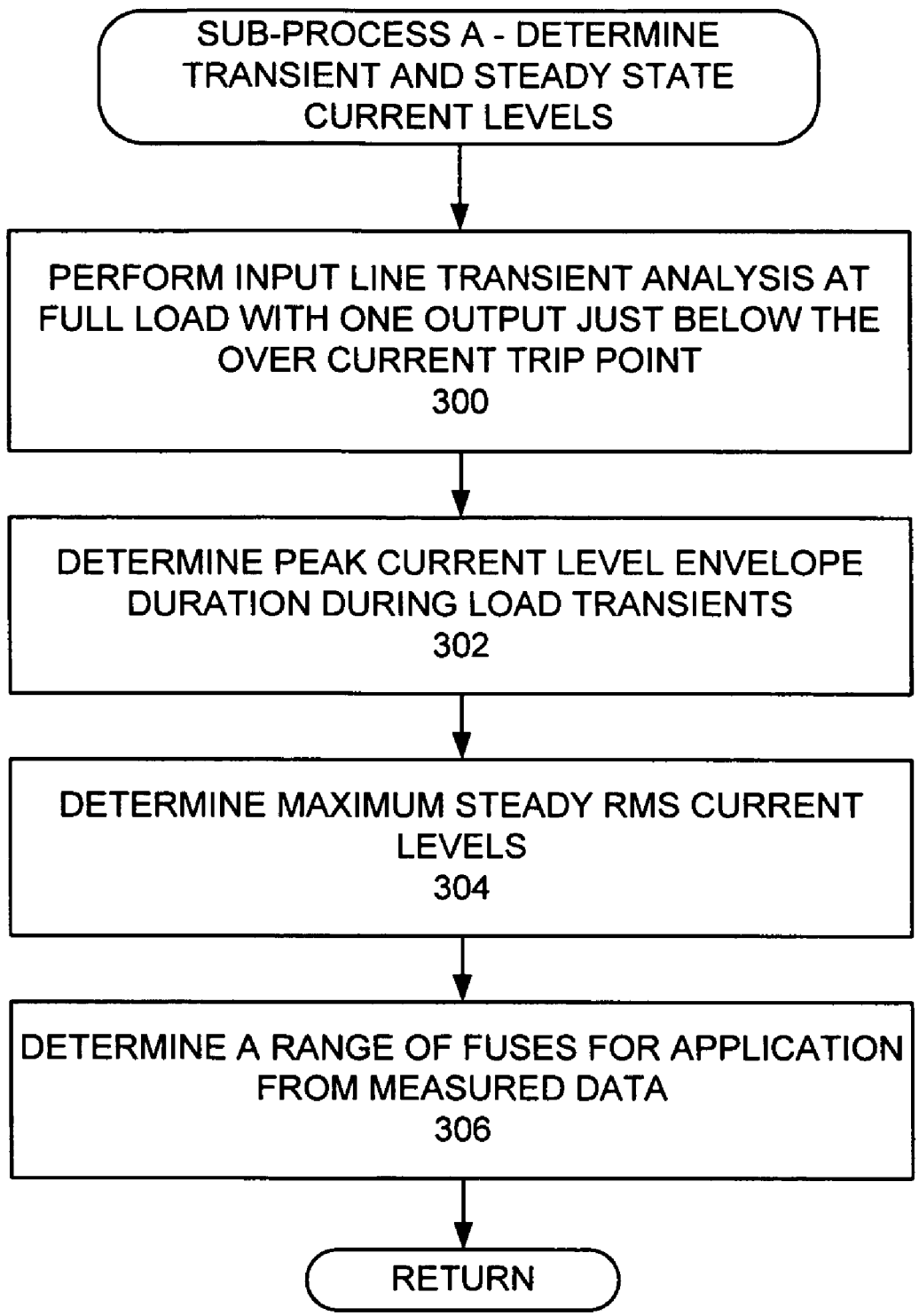
FIGS. 3, 4, 5, 6, and 7 are flow charts, each illustrating exemplary steps for a respective sub-process of the method of FIGS. 2A and 2B in accordance with the preferred embodiment.

Referring also to FIG. 3, there are shown exemplary steps of sub-process A to determine transient and steady state current levels in accordance with the preferred embodiment. Input line transient analysis is performed at full load with one output just below the over current trip point as indicated in a block 300. A peak current level envelope duration during load transients is determined as indicated in a block 302. Next maximum steady RMS (root mean square) current levels are determined as indicated in a block 304. A range of fuses or fuse sizes is determined based upon the measured data as indicated in a block 306. Then the operations return to block 206 in FIG. 2A.

Figure 4:
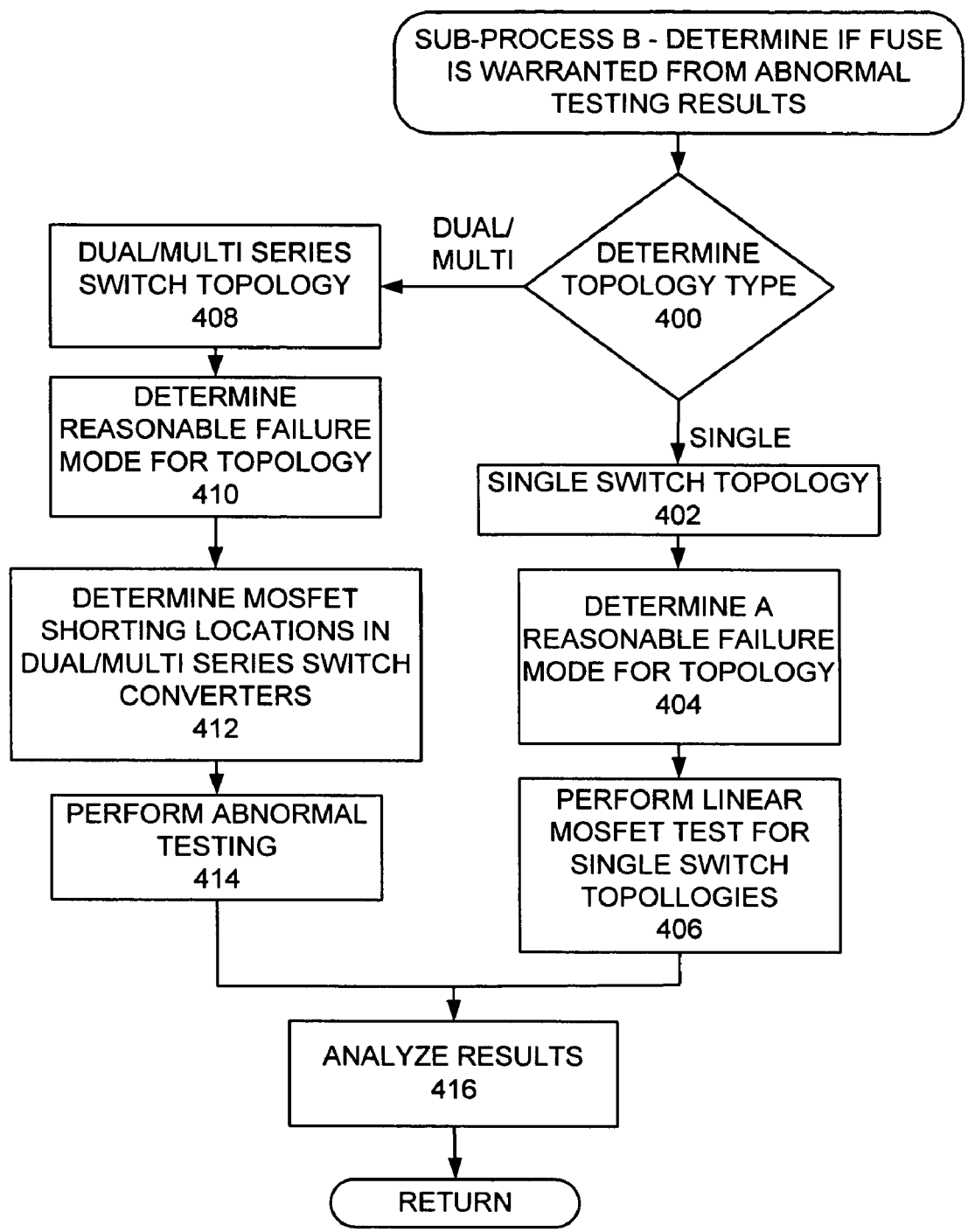

Referring also to FIG. 4, there are shown exemplary steps of sub-process B that is performed to determine if a fuse implementation is warranted from abnormal testing results in accordance with the preferred embodiment. First a topology type of dual/multiple or single switch topology is determined as indicated in a decision block 400. For an identified single switch topology as indicated in a block 402, a reasonable failure mode for the topology is determined as indicated in a block 404. A linear MOSFET (metal oxide semiconductor field effect transistor) test is performed for single switch topologies as indicated in a block 406.

For an identified dual/multi series switch topology as indicated in a block 408, a reasonable failure mode for the topology is determined as indicated in a block 410. MOSFET shorting locations in the dual/multi series switch converters are determined as indicated in a block 412. Abnormal testing is performed as indicated in a block 414. Then the results are analyzed for the single switch topologies and the dual/multi series switch topologies as indicated in a block 416. Then the operations return to block 208 or block 210 in FIG. 2A.

Figure 5:
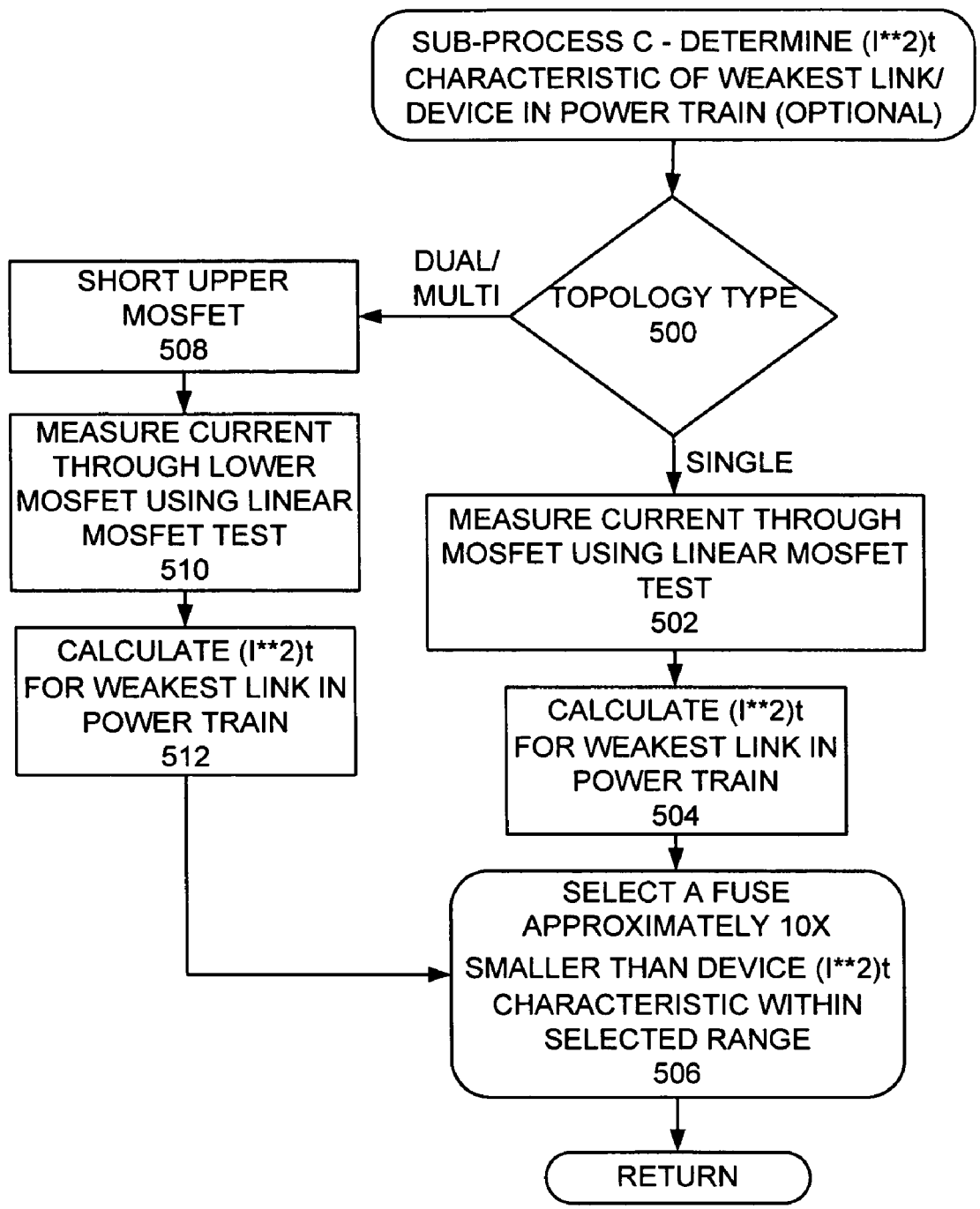

Having reference now to FIG. 5, there are shown exemplary steps of optional sub-process C that is performed to determine an energy-rating characteristic of a weakest link or device in the power train in accordance with the preferred embodiment. First a topology type of dual/multiple or single switch topology is determined as indicated in a decision block 500. For an identified single switch topology, a current through the MOSFET is measured using the linear MOSFET test as indicated in a block 502. Next the energy rating ($I^2t$) is calculated for a weakest link in the power train as indicated in a block 504. A fuse size is selected that is approximately 10 times (10×) less than the device energy rating characteristic with the selected range as indicated in a block 506.

For an identified dual/multi series switch topology, an upper MOSFET is shorted as indicated in a block 508. Then a current through the lower MOSFET is measured using the linear MOSFET test as indicated in a block 510. Next the energy rating ($I^2t$) is calculated for a weakest link in the power train as indicated in a block 512. The fuse size is selected at block 506. Then the operations return to block 212 in FIG. 2A.

Figure 6:
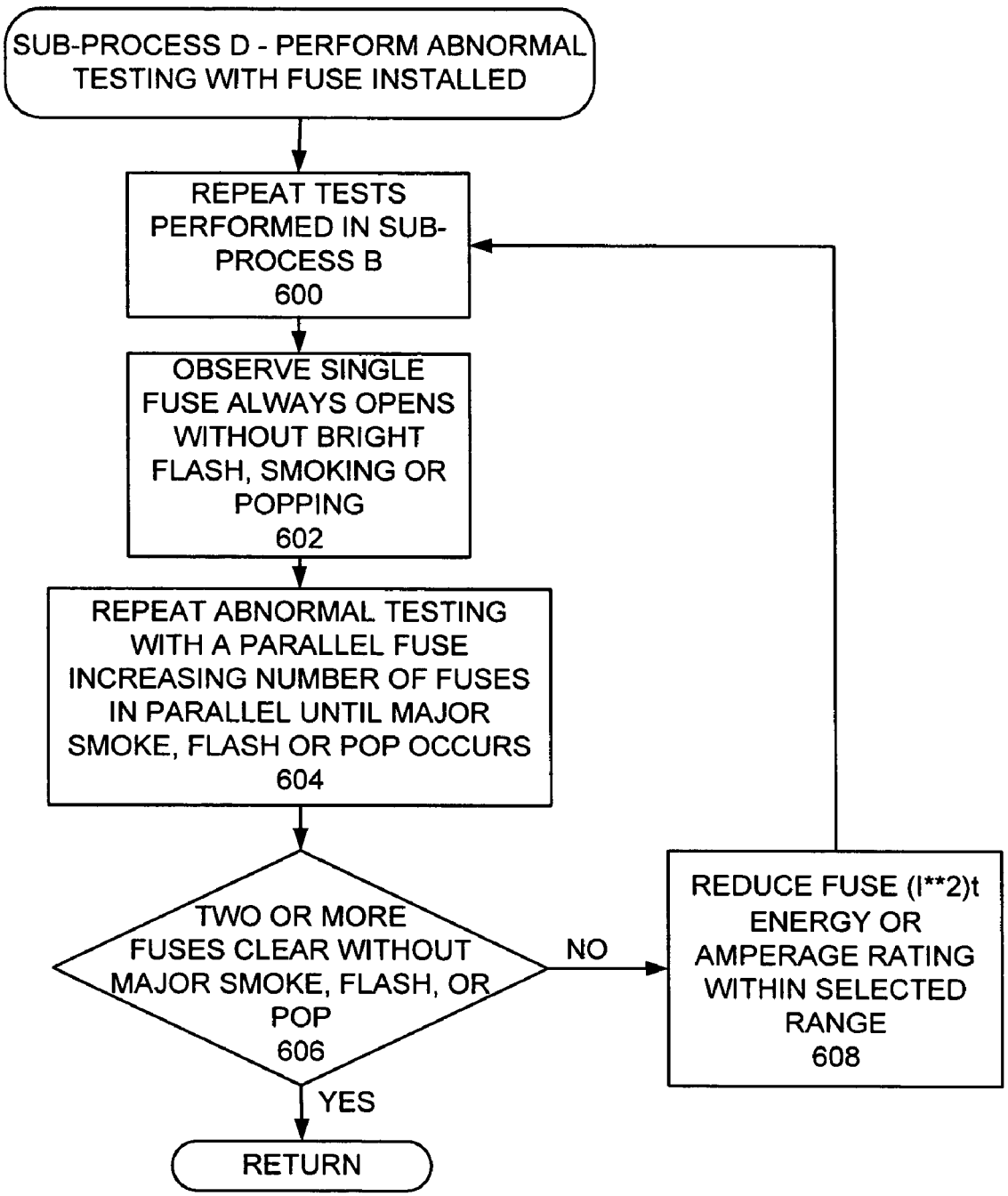

Having reference now to FIG. 6, there are shown exemplary steps of optional sub-process D for performing abnormal testing with the fuse installed in accordance with the preferred embodiment. The tests performed at block 502 and block 510 of FIG. 5 of sub-process B are repeated. Then observe that the single fuse always opens without bright flash, smoking or popping as indicated in a block 602. Abnormal testing is repeated with a parallel fuse of equal size, increasing the number of fuses until a major smoke, flash or pop occurs as indicated in a block 604. Then checking is performed to determine whether two or more fuses clear without major smoke, flash or pop as indicated in a decision block 606. If two or more fuses do not clear without major smoke, flash or pop, then the fuse energy rating or amperage rating is reduced within the selected range as indicated in a block 608 and testing is repeated, returning to block 600. If two or more fuses clear without major smoke, flash or pop, then the operations return to block 224 in FIG. 2B.

Figure 7:
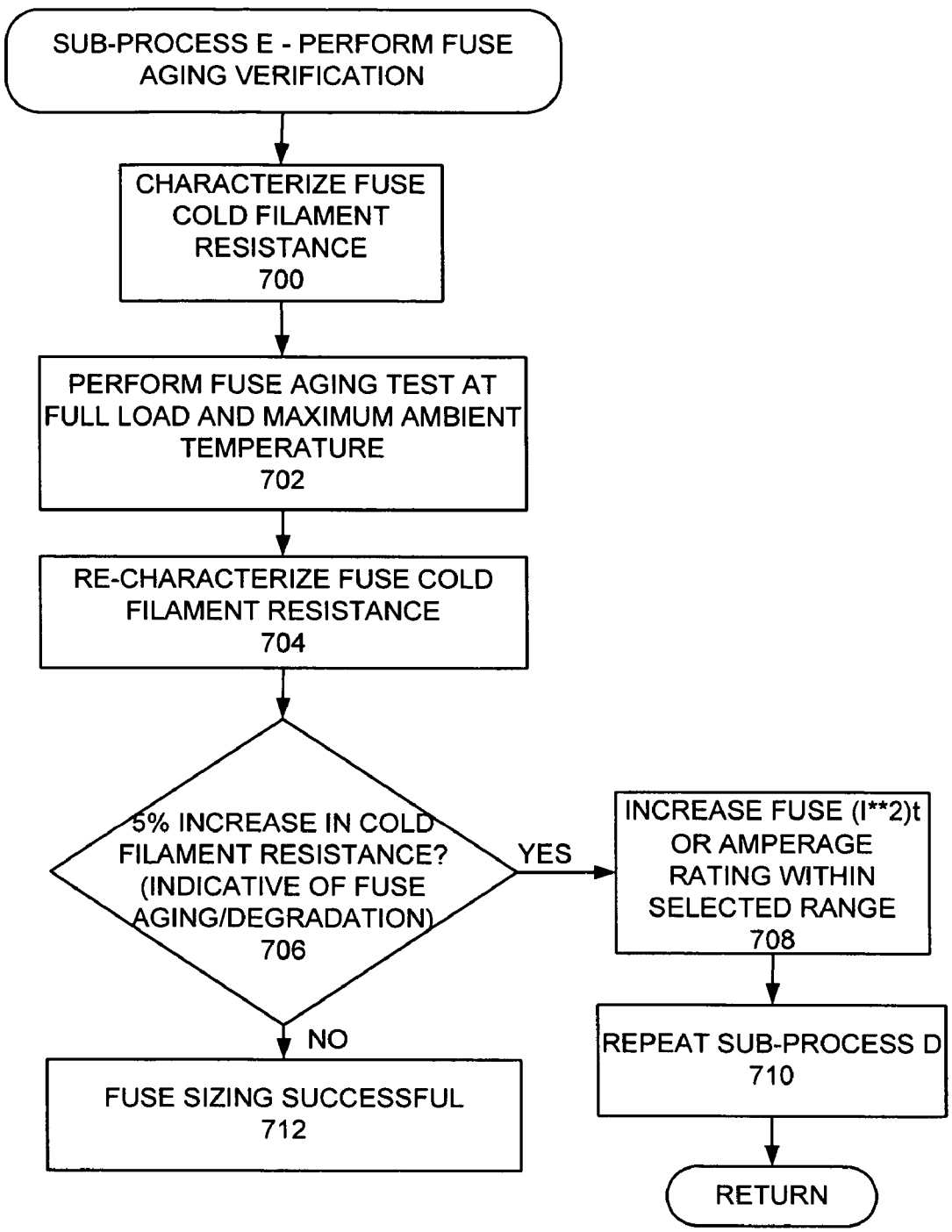

Having reference now to FIG. 7, there are shown exemplary steps of optional sub-process E performed for fuse aging verification in accordance with the preferred embodiment. First the fuse cold filament resistance is characterized as indicated in a block 700. A fuse aging test is performed at full load and maximum ambient temperature as indicated in a block 702. Then the fuse cold filament resistance is re-characterized as indicated in a block 704. Checking is performed to determine whether a 5% increase in cold filament resistance occurred as indicated in a decision block 706. If so, then the fuse energy rating or amperage rating is increased within the selected range as indicated in a block 708 and sub-process D of FIG. 6 is repeated as indicated in a block 710. Then the operations return to block 232 in FIG. 2B. Otherwise, if determined that a 5% increase in cold filament resistance did not occur, then the fuse sizing is successfully completed as indicated in a block 712.

Figure 8:
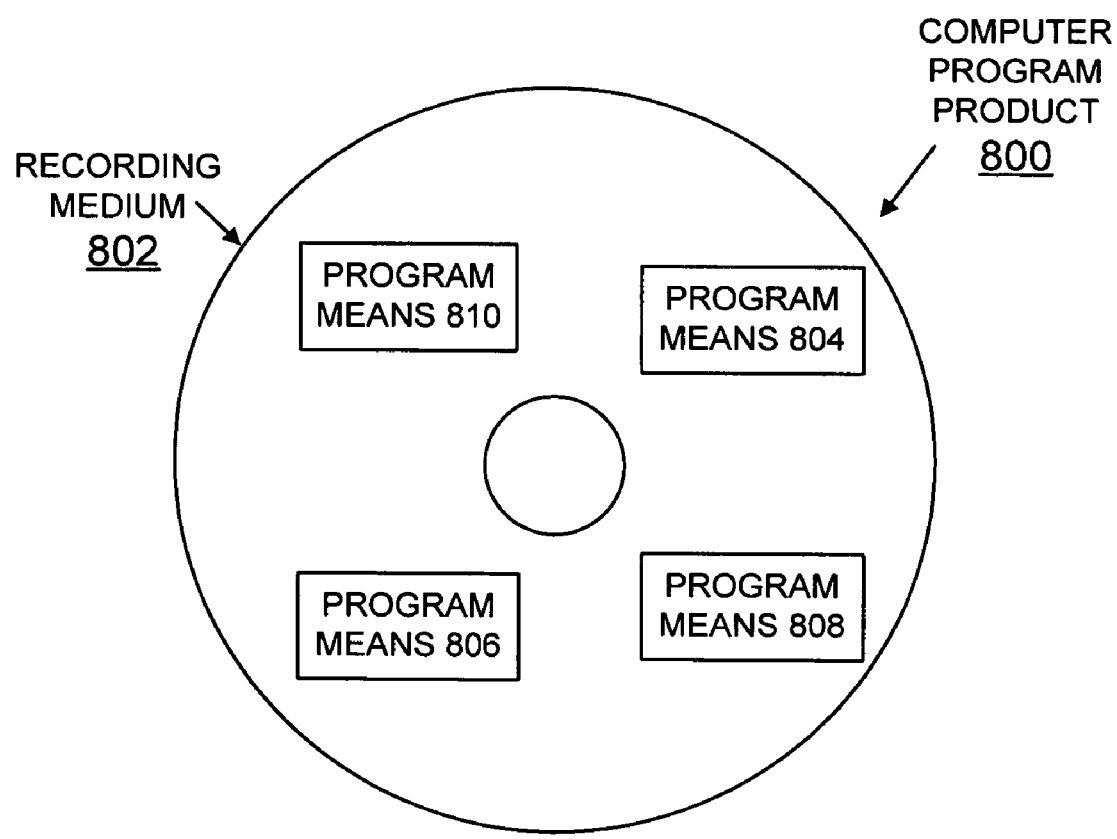
FIG. 8 is a block diagram illustrating a computer program product in accordance with the preferred embodiment.

Referring now to FIG. 8, an article of manufacture or a computer program product 800 of the invention is illustrated. The computer program product 800 includes a recording medium 802, such as, a floppy disk, a high capacity read only memory in the form of an optically read compact disk or CD-ROM, a tape, a transmission type media such as a digital or analog communications link, or a similar computer program product. Recording medium 802 stores program means 804, 806, 808, 810 on the medium 802 for carrying out the methods for implementing fuse placement and sizing for enhanced power system performance of the preferred embodiment in the computer test system 100 of FIG. 1.

A sequence of program instructions or a logical assembly of one or more interrelated modules defined by the recorded program means 804, 806, 808, 810, direct the computer test system 100 for implementing fuse placement and sizing for enhanced power system performance of the preferred embodiment.

While the present invention has been described with reference to the details of the embodiments of the invention shown in the drawing, these details are not intended to limit the scope of the invention as claimed in the appended claims.

What is claimed is:

1. A method for implementing fuse placement and sizing for enhanced power system performance comprising:
   processing power supply system design data and test data for a power supply system; determining main power paths in said power supply system; and identifying a power path of said determined main power paths in said a power supply system having a predefined component failure mode for placement of a fuse;
   determining transient and steady state current levels for each said determined main power paths;
   identifying a fuse size range based upon the determined transient and steady state current levels; said fuse size range being identified to enable said power supply system to perform to specification without opening a fuse within said fuse size range; and
   selecting a fuse size within said identified fuse size range.

2. A method for implementing fuse placement and sizing for enhanced power system performance as recited in claim 1 further includes testing a fuse having said selected fuse size in said identified power path to ensure said fuse opens before combustion, smoke, or flash occurs.

3. A method for implementing fuse placement and sizing for enhanced power system performance as recited in claim 2 wherein the testing includes performing fuse testing for said predefined component failure mode.

4. A method for implementing fuse placement and sizing for enhanced power system performance as recited in claim 1 wherein identifying a power path of said determined main power paths in said power supply system having a predefined component failure mode for placement of a fuse includes performing a predefined test for said power path having said predefined component failure mode, and analyzing results of said predefined test.

5. A method for implementing fuse placement and sizing for enhanced power system performance as recited in claim 1 wherein identifying a power path having a predefined component failure mode for placement of a fuse includes providing a fuse integrated within a solid state semiconductor device in the identified power path.

6. A method for implementing fuse placement and sizing for enhanced power system performance as recited in claim 1 wherein selecting a fuse size within said identified fuse size range includes testing a power system with an installed fuse of said selected fuse size.

7. A method for implementing fuse placement and sizing for enhanced power system performance as recited in claim 6 includes checking for normal operation of the power system without opening said fuse.

8. A method for implementing fuse placement and sizing for enhanced power system performance as recited in claim 1 further includes selecting said fuse size with an energy rating lower than an energy rating of each solid state device in said identified power path.

9. A computer program product for implementing fuse placement and sizing for enhanced power system performance of a system under test with a computer test system, said computer program product including a plurality of computer executable instructions stored on a computer recording medium, wherein said instructions, when executed by the computer test system cause the computer test system to perform the steps of:
   processing power supply system design data and test data for a power supply system; determining main power paths in said power supply system; and identifying a power path of said determined main power oaths in said power supply system having a predefined component failure mode for placement of a fuse;
   determining transient and steady state current levels for each said determined main power paths;
   identifying a fuse size range based upon the determined transient and steady state current levels; said fuse size range being identified to enable said power supply system to perform to specification without opening a fuse within said fuse size range; and
   selecting a fuse size within said identified fuse size range.

10. A computer program product for implementing fuse placement and sizing for enhanced power system performance as recited in claim 9 further includes testing a fuse having said selected fuse size in said identified power path to ensure said fuse opens before combustion, smoke, or flash occurs.

11. A computer program product for implementing fuse placement and sizing for enhanced power system performance as recited in claim 9 wherein selecting a fuse size within said identified fuse size range includes testing a power system with an installed fuse of said selected fuse size.

12. A computer program product for implementing fuse placement and sizing for enhanced power system performance as recited in claim 11 includes checking for normal operation of the power system without opening said fuse.

13. A computer program product for implementing fuse placement and sizing for enhanced power system performance as recited in claim 11 further includes selecting said fuse size with an energy rating lower than an energy rating of each solid state device in said identified power path.

14. A computer program product for implementing fuse placement and sizing for enhanced power system performance as recited in claim 9 wherein identifying a power path of said determined main power paths in said power supply system having a predefined component failure mode for placement of a fuse includes performing a predefined test for said identified power path, and analyzing results of said predefined test.

15. A computer program product for implementing fuse placement and sizing for enhanced power system performance as recited in claim 9 wherein identifying a power path having a predefined component failure mode for placement of a fuse includes providing a fuse integrated within a solid state semiconductor device in the identified power path.

16. A computer program product for implementing fuse placement and sizing for enhanced power system performance as recited in claim 9 further includes testing a fuse having said selected fuse size in said identified power path to ensure normal operation of the power supply system without opening said fuse and to ensure said fuse opens before combustion, smoke, or flash occurs.

17. Apparatus for implementing fuse placement and sizing for enhanced power system performance comprising:
 a test interface for connection to a power supply system under test; and
 a fuse optimizing design program including a plurality of computer executable instructions stored on a computer recording medium, said instructions being executed by a computer test system; said instructions of said fuse optimizing design program for receiving and processing power supply system design data and test data for a power supply system; for determining main power paths in said power supply system; and for identifying a power path of said determined main power paths in said a power supply system having a predefined component failure mode for placement of a fuse; for determining transient and steady state current levels for each said determined main power paths; for identifying a fuse size range based upon the determined transient and steady state current levels; said fuse size range being identified to enable said power supply system to perform to specification without opening a fuse within said fuse size range; and for selecting a fuse size within said identified fuse size range.

18. Apparatus for implementing fuse placement and sizing for enhanced power system performance as recited in claim 17 wherein said fuse optimizing design program performs testing of a power system with an installed fuse of said selected fuse size.

19. Apparatus for implementing fuse placement and sizing for enhanced power system performance as recited in claim 18 wherein said fuse optimizing design program checks for normal operation of the power system without opening said fuse.

20. Apparatus for implementing fuse placement and sizing for enhanced power system performance as recited in claim 17 wherein said fuse optimizing design program selects said fuse size with an energy rating lower than an energy rating of each solid state device in said identified power path.

* * * * *